(12) United States Patent
Huang et al.

(10) Patent No.: US 7,041,435 B2
(45) Date of Patent: May 9, 2006

(54) METHOD OF MANUFACTURING MICRO ACTUATED BLAZED GRATING

(75) Inventors: Long-Sun Huang, Taipei (TW); Yao-Hui Kuo, Kaohisung (TW)

(73) Assignee: Walsin Lihwa Corp., Taipei (TW)

( * ) Notice: Subject to any disclaimer, the term of this patent is extended or adjusted under 35 U.S.C. 154(b) by 0 days.

(21) Appl. No.: 10/812,133

(22) Filed: Mar. 29, 2004

(65) Prior Publication Data

US 2004/0191647 A1 Sep. 30, 2004

(30) Foreign Application Priority Data

Mar. 31, 2003 (TW) .............................. 92107312 A

(51) Int. Cl.
*B81B 3/00* (2006.01)

(52) U.S. Cl. ................ 430/321; 430/319; 430/330; 216/13; 216/24

(58) Field of Classification Search ................ 430/314, 430/319, 321; 216/13, 24
See application file for complete search history.

(56) References Cited

U.S. PATENT DOCUMENTS

| 6,238,581 | B1 * | 5/2001 | Hawkins et al. ............... 216/13 |
| 2004/0027225 | A1 * | 2/2004 | Lee et al. ...................... 337/36 |
| 2004/0224523 | A1 * | 11/2004 | Bae et al. ................... 438/706 |

FOREIGN PATENT DOCUMENTS

JP 6-343272 A * 12/1994

* cited by examiner

*Primary Examiner*—John A. McPherson
(74) *Attorney, Agent, or Firm*—Volpe and Koenig, PC

(57) ABSTRACT

A method for manufacturing a grating is provided. The method includes the steps as follows: a) forming a first insulating layer on a substrate; b) forming a silicon oxide layer on the first insulating layer; c) forming and hard baking a photoresist on the silicon oxide layer for defining a plurality of specific zones; d) etching the first insulating layer and the silicon oxide layer within the specific zones respectively for forming a plurality of concaves; e) forming a second insulating layer on the silicon oxide layer; f) defining a plurality of grating zones onto the second insulating layer, and forming an adhesive layer and a conductive layer on the grating zones in sequence; g) removing parts of the second insulating layer located outside of the grating zones; and h) removing the silicon oxide layer for exposing a plurality of grating structures within the grating zone.

16 Claims, 8 Drawing Sheets

METHOD OF MANUFACTURING MICRO ACTUATED BLAZED GRATING

FIELD OF THE INVENTION

This invention relates to a method for manufacturing a grating, and especially to a method used to manufacture a micro actuated blazed grating.

BACKGROUND OF THE INVENTION

Please refer to FIG. 1(a), which is a top view of the micro actuated blazed grating according to the prior art. As shown in FIG. 1(a), in order to own the following properties, such as being performed as an optical switch, having a blazed grating shape, and maintaining the grating shape after being actuated, a conventional micro actuated blazed grating mainly includes the silicon substrate 1, the structural pillar 2, the torsion bar 3, and the suspended grating mirror 4.

Please refer to FIGS. 1(b)–(c), which are the schematic diagrams showing the employments of the micro actuated blazed gratings in FIG. 1(a). As shown in FIG. 1(b), the reflective light 6 is generated by reflecting the incident light 5 with the grating mirror 4 when no voltage is applied to the micro actuated blazed grating. As shown in FIG. 1(c), when a voltage is applied to the micro actuated blazed grating, the grating mirror 4 is twisted at a rotative angle via the torsion bar 3 and the structural pillar 2. In which, the structural pillar 2 is used as the fulcrum of the rotation, and the rotative angle is called a blazed angle of the micro actuated blazed grating. Also, when the grating mirror 4 is twisted, the incident light 5 would be diffracted into the diffractive lights 7. According to the aforesaid design, the micro actuated blazed grating is able to be employed as an optical switch and perform the inherently physical properties as that of a common blazed grating.

The conventional manufacturing method of the micro actuated blazed grating is performed by three masks and the surface micromachining technology. Further, the manufacturing method can be divided into four parts: a) the manufacture of the lower electrodes, b) the manufacture of the structural pillars, c) the manufacture of the main body of the micro actuated blazed grating, and d) the release of the structures.

a) The manufacture of the lower electrode: A lower electrode is made from a silicon substrate and a silicon nitride. Preferably, the silicon substrate is a silicon wafer with a low resistance (<1 Ω-cm) so as to raise the conductivity of the lower electrode.

b) The manufacture of the structural pillar: The size of the structural pillar is determined by the size of the chosen mask, and the height thereof is determined by the thickness of the deposited thin film. In which, the height of the structural pillar equals to the thickness of the sacrificial layer. Further, the structural pillar is what is used for connecting the main body to the silicon substrate. The driving voltage of the micro actuator and the rotative angle of the grating mirror are determined by the height of the structural pillar (the thickness of the sacrificial layer). Further, the height of the structural pillar also plays a determinant role in the release process of the structures, since the structures would hardly be released when the thickness of the sacrificial layer (the height of the structural pillar) is not enough.

The relevant manufacturing methods of the structural pillar are schematically described as follows. After the lower electrode is manufactured, a sacrifice layer of aluminum or copper is formed on the silicon substrate by the plasma enhanced chemical vapor deposition (PECVD). Then, a photoresist is coated on the sacrifice layer and the positions of the structural pillars are defined by the mask. After developed, the phoresist having the defined positions of the structural pillars is processed under short-time hard bake with a high-temperature. After the hard bake, the phoresist is employed as the etch resist. Then, the sacrifice layer is etched by the reactive ion etch (RIE) method for forming the shapes of the structural pillars, and the photoresist is removed. After that, the low-stress silicon nitride is filled into the shapes of the structural pillars by the low-pressure chemical vapor deposition (CVD), and the structural pillars are accomplished accordingly.

c) The manufacture of the main body of the micro actuated blazed grating: The shape and the area of the main body are defined on the manufactured structural pillars by the third mask. After developed, the remained photoresist are removed. Then, a chromium layer regarded as an adhesive layer, and an aurum layer regarded as a conductive layer and an exposed layer are respectively coated thereon. After that, the structural shape of the main body and the area of the upper electrode are defined by the lift-off process. Afterwards, the main body of the micro actuated blazed grating is formed by etching with the RIE, in which the aurum layer is regarded as a cover layer.

d) The release of the structures: The last step for the elements manufactured by the surface micromachining technology is to release the structures and makes as them suspended. In which, the sacrifice layer is removed by the hydrofluoric acid solution. The relevant processing time is determined by the thickness of the sacrifice layer and the size of the main body of the micro actuated blazed grating.

However, the conventional manufacturing method of the micro actuated blazed grating has three defects as follows.

1) The performance of the sacrifice layer is unideal. The aluminum is always employed as the sacrifice layer in MEMS manufacture, since it is cheap, easy-obtained, and can be etched by acids and bases. On the other hand, since it is etched by acids and bases, it might be slightly etched by the developing agent as well during developed, which seriously affets the accuracy-needed MEMS structure. However, since the formula of the present developing agent has been changed and would not damage the aluminum, the above problem has been overcome. But another problem about the hydrogen formed during aluminum etched is still unsolved. Since the formed hydrogen has separated the aluminum from the etching agent, the inner of the aluminum layer might be etched incompletely. In addition, since the formation of the hydrogen will cause a force pressing on the inner structure of the grating, the structure of the grating might be damaged accordingly. As above, an aluminum sacrifice layer is unideal.

For solving the foresaid problems about the formation of the hydrogen, a copper is used to manufacture the sacrifice layer. At present, the etching solution for a copper sacrifice layer contains 8% (w/w) copper chloride and 8% (w/w) ammonium chloride. The advantage of the copper sacrifice layer is no hydrogen formation, but the disadvantage is that the etching rate is hardly under control. When treating a 2 µm×2 µm×2 µm area, the etching time for an aluminum sacrifice layer is 15 min, but the etching time for a copper sacrifice layer is 15–20 min. However, the etching time for completely removing the copper sacrifice layer is longer than that for forming the concavities of the structural pillars still. That is to say once the copper sacrifice layer is completely removed by etching, the sizes of the concavities of structural pillars will be too large. Nevertheless, the main structure of the grating and the torsion elements will be affected by the oversized cavities of the structural pillars. Therefore, a copper sacrifice layer is unideal, either.

2) The shape of the photoresit is changed during the period of short-time hard bake with high-temperature. The structural pillars are manufactured by a processing of defining it with a second mask, and the effects of the processing are the determinants to the appearances of the manufactured structural pillars and straightness of the torsion elements. In the manufacturing method of the structural pillars, the silicon oxide layer is etched by a reactive ion etching and the mask is used as a cover, and the mask should be treated under short-time hard bake with high-temperature first for hardening. However, since the shape of the photoresist is changed, the inner solvent of the photoresist would be volatilized quickly when being heated. Further, since the shape of the structural pillars is determined by the photoresis and the shape of the photoresist is changed in the baking process, the shape of the structural pillars is changed accordingly. For example, once the shapes of the edges and corners of the photoresist become very smooth, the appearance of the manufactured structural pillars would be changed accordingly. In other words, an undesired shape of the structural pillar might be formed due to the fact that the shape of the applied photoresist is changed.

3) The coatings of the chromium layer and the aurum layer are bad, so that the aurum layer might be lifted and the chromium layer might be etched by the hydrofluoric acid. It's known in Multi-User MEMS Processes (MUMPs) that the etching time for a silicon wafer in the hydrofluoric acid is 1.5–2.0 min. Generally, since the main body of the micro actuated blazed grating is a wide and long structure, the etching time for the main body of the micro actuated blazed grating is at least 8.5 min. However, during the etching of the main body of the micro actuated blazed grating, parts of the aurum layer would be lifted in 3–5 minutes, and therefore some parts of the chromium layer are etched by the hydrofluoric acid since then.

According to the above, the new manufacture method of micro actuated blazed grating and the structure thereof are the current subjects in the industry.

SUMMARY OF THE INVENTION

It is an object of the present invention to provide a method for manufacturing a grating. The method includes steps of: a) providing a substrate; b) forming a first insulating layer on the substrate; c) forming a silicon oxide layer on the first insulating layer; d) forming and hard baking a photoresist on the silicon oxide layer for defining a plurality of specific zones; e) etching the first insulating layer and the silicon oxide layer within the specific zones respectively for forming a plurality of concaves; f) forming a second insulating layer on the silicon oxide layer, wherein the second insulating layer fills the concaves for forming a plurality of structural pillars therein; g) defining a plurality of grating zones onto the second insulating layer; h) forming an adhesive layer and a conductive layer on the grating zones in sequence, wherein the grating zones comprise the structural pillars; i) removing parts of the second insulating layer located outside of the grating zones; and j) removing the silicon oxide layer for exposing a plurality of grating structures within the grating zone.

Preferably, the substrate is a silicon insulating substrate.

Preferably, the first insulating layer and the second insulating layer both are silicon nitride layers formed by a low pressure chemical vapor deposition (LPCVD).

Preferably, the first insulating layer has a thickness ranged from 2500–3000 Å.

Preferably, the step b) further includes a step b1) of forming an electrode on the first insulating layer.

Preferably, the step c) is performed by a plasma enhanced chemical vapor deposition (PEVCD).

Preferably, the silicon oxide layer has a thickness ranged from 1.5–2 μm.

Preferably, the step d) is proceeded under a temperature of 70–90° C. for 2–5 hours.

Preferably, the step e) is performed by a reactive ion etching (RIE).

Preferably, the step h) is proceeded with an evaporation deposition rate of 0.1–0.2 Å/sec.

Preferably, the adhesive layer includes a metal material selected from a group consisting of a chromium (Cr), a titanium (Ti), and an alloy of titanium (Ti) and tungsten (W).

Preferably, the adhesive layer has a thickness ranged from 150–200 Å.

Preferably, the conductive layer is a gold layer.

Preferably, the gold layer has a thickness ranged from 1500–2000 Å.

Preferably, the step i) is performed by an RIE method.

Preferably, the step j) is performed by a wet etching method using an etching solution.

Preferably, the etching solution is a hydrofluoric acid (HF).

In accordance with another aspect of the present invention, another method for manufacturing a grating is provided. The method includes steps of: a) providing a substrate having a first insulating layer and a silicon oxide layer thereon; b) forming a plurality of concaves onto the silicon oxide layer; c) forming a second insulating layer on the silicon oxide layer, wherein the second insulating layer fills the concaves for forming a plurality of structural pillars therein; d) defining a plurality of grating zones on the second insulating layer; e) forming an adhesive layer and a conductive layer on the grating zones in sequence, wherein the grating zones comprise the structural pillars; f) removing parts of the second insulating layer located outside of the grating zones; and g) removing the silicon oxide layer for exposing a plurality of grating structures within the grating zone.

Preferably, the substrate is a silicon insulating substrate, and the first insulating layer and the second insulating layer both are silicon nitride layers formed by a low pressure chemical vapor deposition (LPCVD).

Preferably, the step b) further includes steps of: b1) forming a photoresist onto the silicon oxide layer; b2) hard baking the silicon oxide layer having the photoresis thereon for forming a plurality of specific zones; and b3) etching the first insulating layer and the silicon oxide layer within the specific zones for forming the concaves.

Preferably, the adhesive layer comprises a metal material selected from a group consisting of a chromium (Cr), a titanium (Ti), and an alloy of titanium (Ti) and tungsten (W).

Preferably, the conductive layer is a gold layer.

Preferably, the step f) is performed by an RIE method, and the step g) is performed by a wet etching method using an etching solution of hydrofluoric acid (HF).

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments.

Figure 1A:
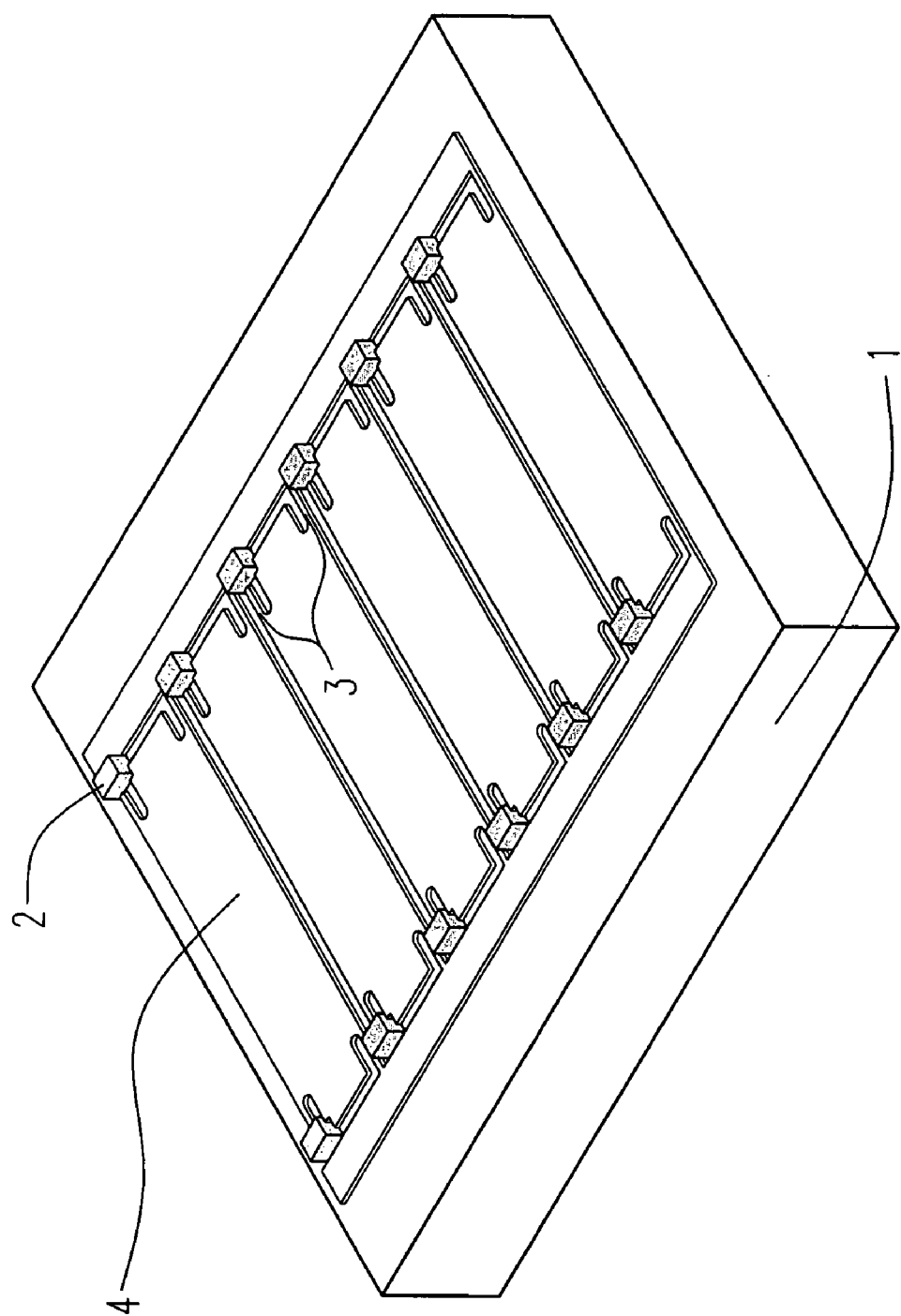
FIG. 1(a) is a top view of the micro actuated blazed gratings according to the prior art.
Figure 1B:
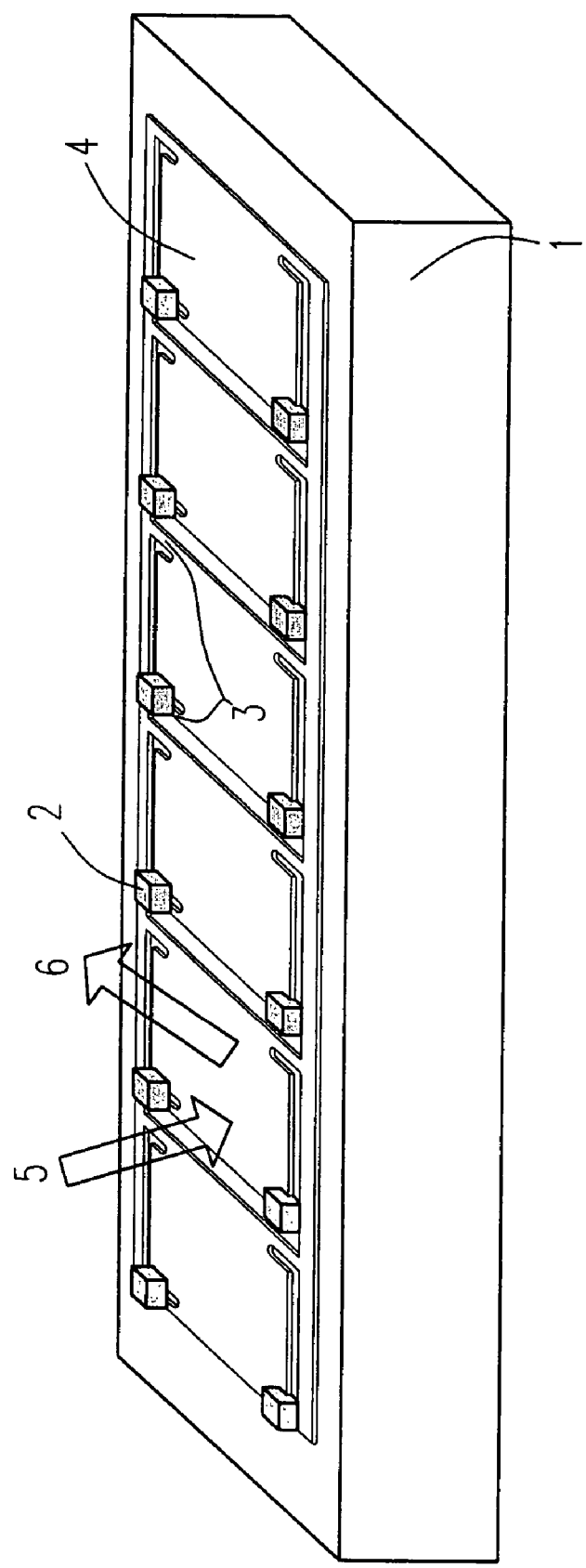
FIGS. 1(b)–(c) are the schematic diagrams showing the employments of the micro actuated blazed grating in FIG. 1(a)
Figure 1C:
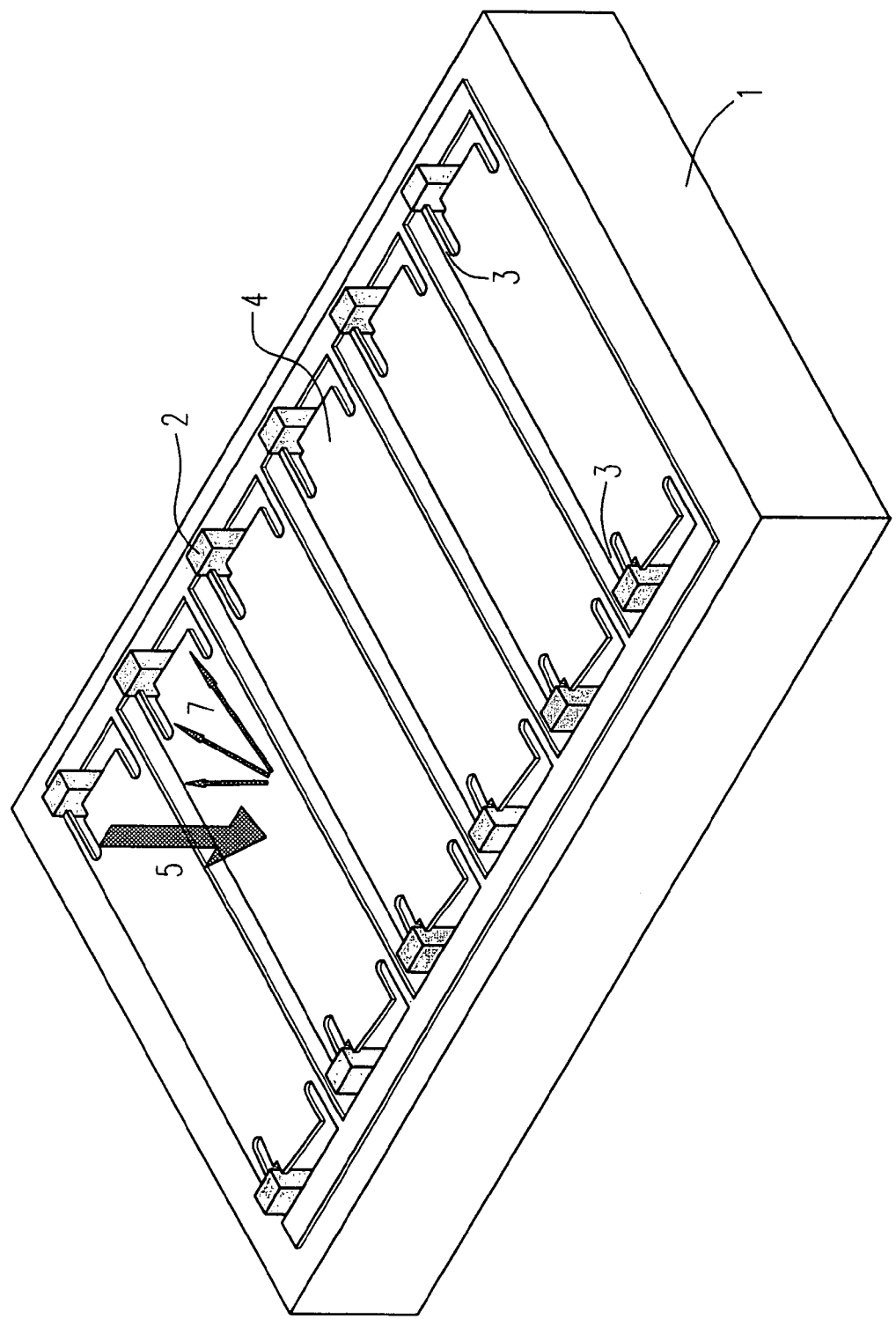
Figure 2A:
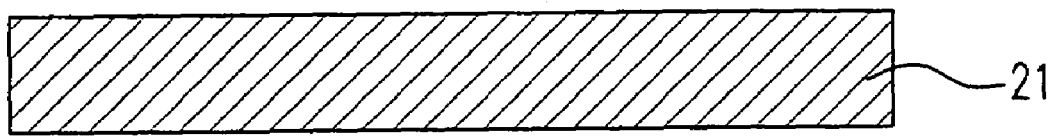
FIGS. 2(a)–(c) are the flow charts of the manufacturing method of the lower electrode according to a preferred embodiment of the present invention.
Figure 2B:
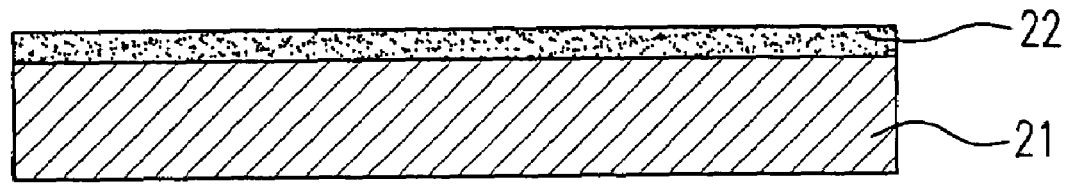
Figure 2C:
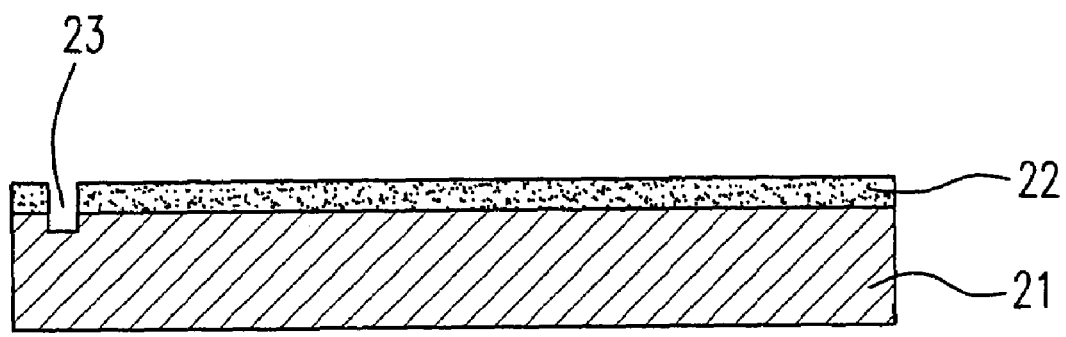

Please refer to FIGS. 2(a)–(c), which are the flow charts of the manufacture process of the lower electrodes according to a preferred embodiment of the present invention. First of all, the low-resistance insulating silicon substrate 21 is provided, and then the silicon nitride 22 with the thickness of 3000 Å is formed by the low pressure chemical vapor deposition (LPCVD). The silicon nitride 22 would be used as the insulating layer after the landing of the main body of the grating applied with a voltage. Secondly, the photoresist (not shown) is coated on the silicon nitride 22 and a mask (not shown) is used to define a lower electrode area (not shown). Finally, the lower electrode 23 is manufactured by etching the lower electrode area with the RIE.

Figure 3A:
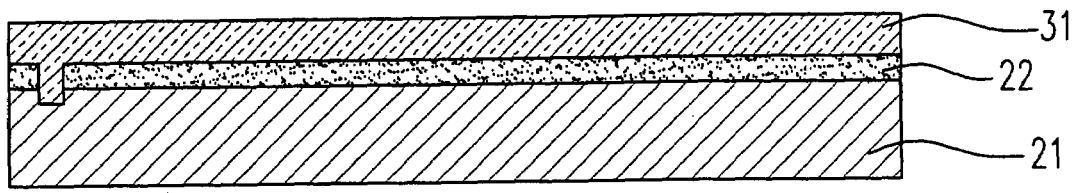
FIGS. 3(a)–(d) are the flow charts of the manufacturing method of the structural pillars according to a preferred embodiment of the present invention.
Figure 3B:
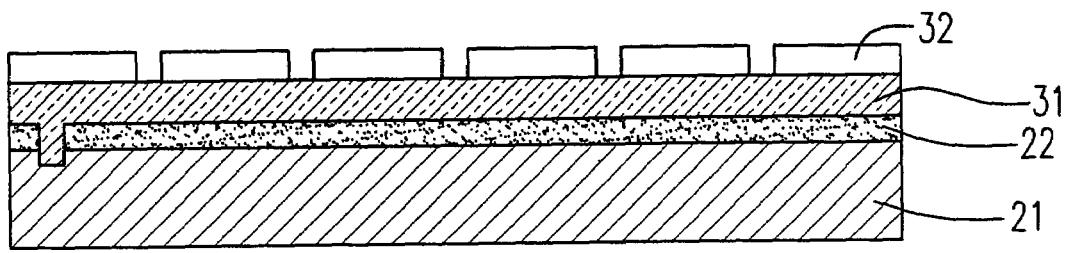

Please refer to FIGS. 3(a)–(d), which are the flow charts of the manufacture process of the structural pillars according to a preferred embodiment of the present invention. As shown in FIG. 3(a), after the lower electrode 23 is manufactured, the silicon monoxide layer 31 with the thickness of 1.5–2.0 μm is formed by the PECVD. Then, as shown in FIG. 3(b), the photoresist 32 is coated thereon and the areas of the structural pillars are defined with a mask (not shown). After developed, the photoresist 32 with the defined areas of the structural pillars is processed by a hard bake under a condition of low processing temperature and long processing period for preventing the shape of the photoresist 32 from being changed. Preferably, the processing temperature is under 90° C., such as 70–80° C., and the processing period is 2–5 hours.

Figure 3C:
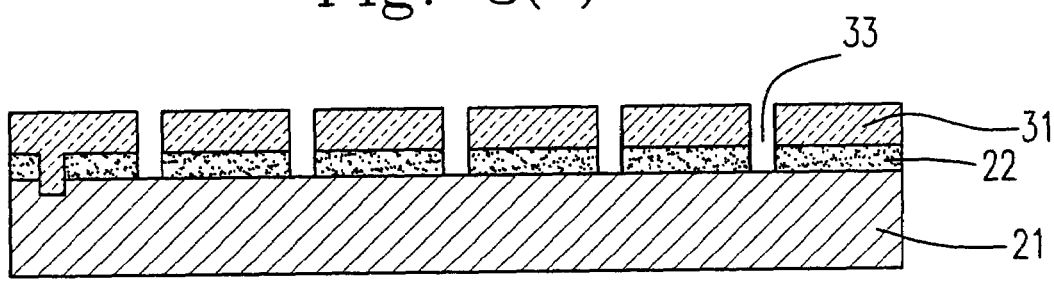
Figure 3D:
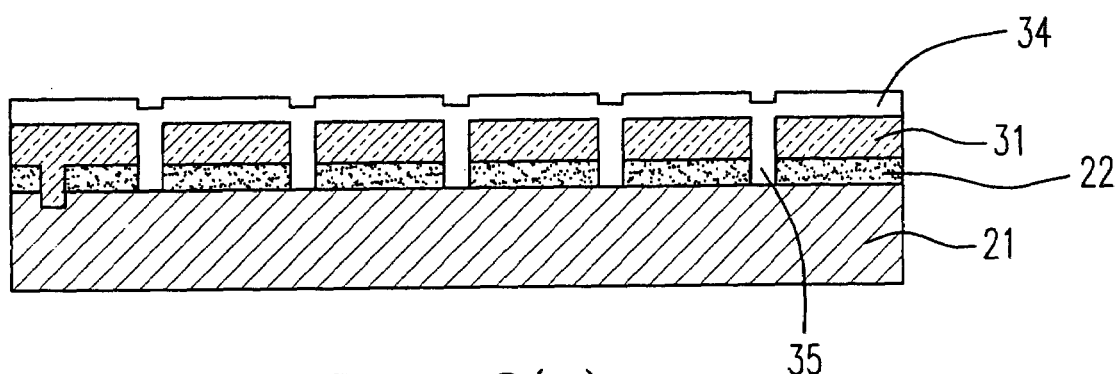

After the hard bake, the concavity 33 is formed by etching the silicon monoxide 31 with the RIE, wherein the photoresist 32 is used as the etching resist. In which, the concavity 33 is the position where needs to be filled with the structural pillar. Then, the photoresist 32 is removed, as shown in FIG. 3(c). It is to be noted that the concavity 33 should be etched deeply enough to expose partial area of the silicon substrate 21. Subsequently, the low-stress silicon nitride 34 with the thickness of 1.75 μm is formed by the LPCVD. Meanwhile, the structural pillar 35 is formed by the LPCVD, as shown in FIG. 3(d).

Figure 4A:
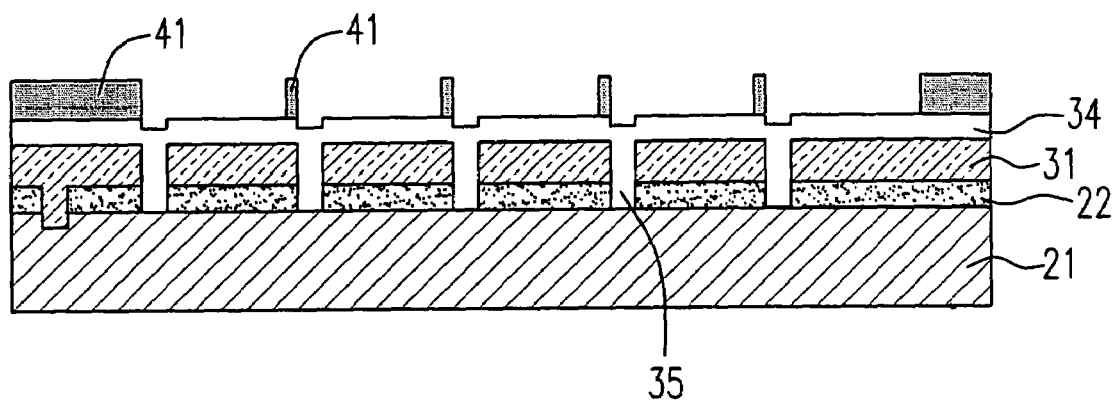
FIGS. 4(a)–(d) are the flow charts of the manufacturing method of the main body of the micro actuated blazed grating according to a preferred embodiment of the present invention.

Please refer to FIGS. 4(a)–(d), which are the flow charts of the manufacturing method of the main body of the micro actuated blazed grating according to a preferred embodiment of the present invention. In which, the low-stress silicon monoxide is selected as the material of the main body of the micro actuated blazed grating in order to avoid the unevenness of the structure and the short circuit occurred therein. As shown in FIG. 4(a), a mask (not shown) is used to define the shape and the area of the main body, and the photoresist 41 is formed after steps of the development and the bake. In order to avoid the shape of the photoresist 41 being changed and to ensure the smooth going of the following lift-off manufacture, the preferably processing temperature of the bake is 90° C. and the preferably processing period thereof is less than 10 minutes. In addition, in order to ensure the photoresist 41 is the remained photoresist fully developed, which is good for depositing a metal thereon, a pure oxygen processing with 15 seconds is used to remove the incompletely developed photoresist. In which, the pure oxygen processing is carried out with the RIE.

Figure 4B:
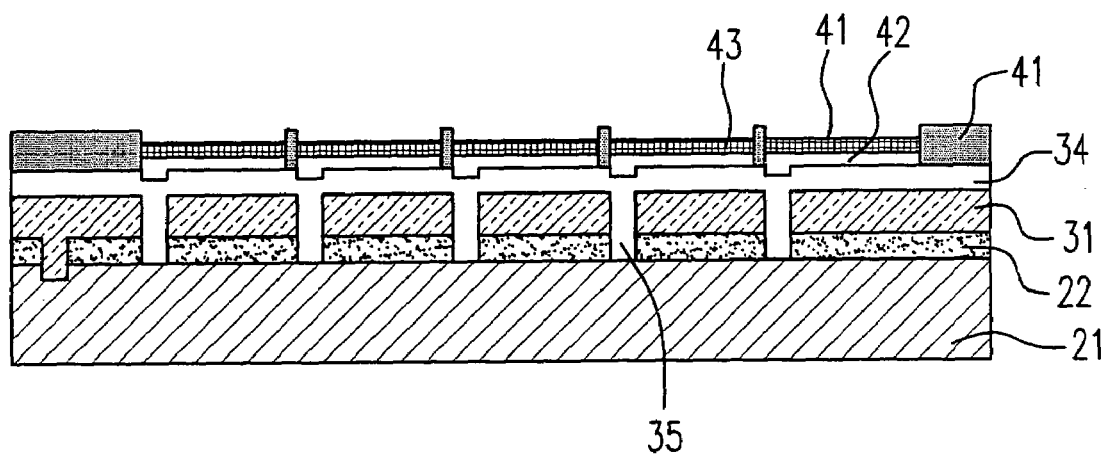
Figure 4C:
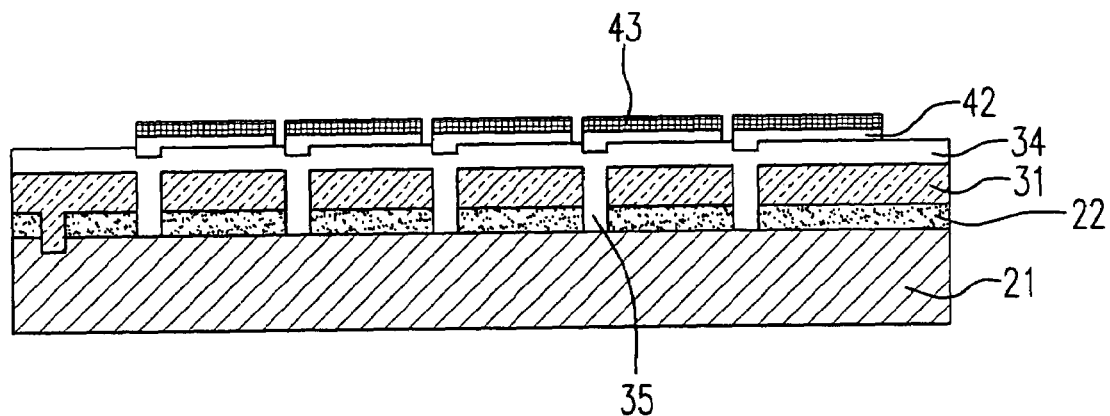
Figure 4D:
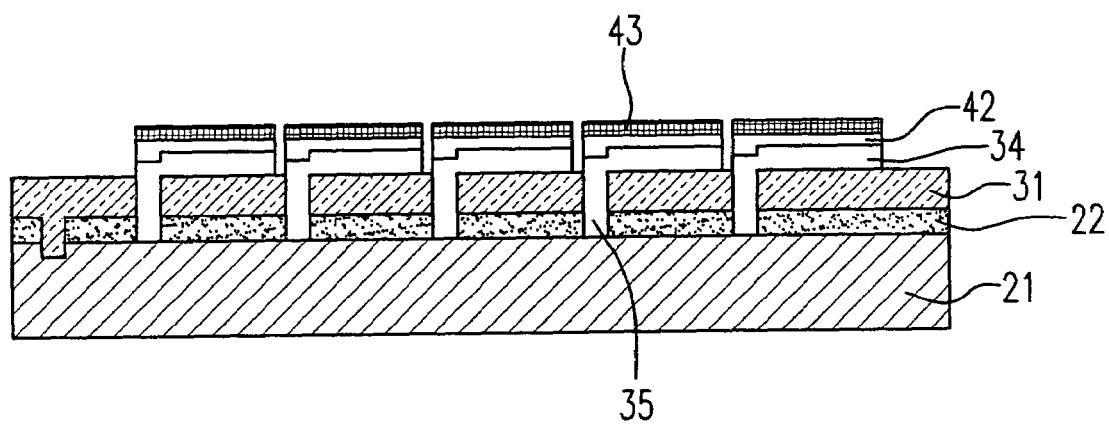

Then, as shown in FIG. 4(b), the chromium layer 42 with the thickness of 150 Å is coated as an adhesive layer via an evaporation process with a deposition rate of 0.1 to 0.2 Å/sec. And then the aurum layer 43 with the thickness of 1500 Å is coated thereon. In which, the chromium layer 42 is used as the adhesive layer and the aurum layer 43 is used as the exposed layer of the micro actuated blazed grating and the conductive layer thereof. After that, as shown in FIG. 4(c), the areas of the main structure of the micro actuated blazed grating and the upper electrode (aurum layer 43) are shaped up by the lift-off process. Sequentially, as shown in FIG. 4(d), the main body of the micro actuated blazed grating is formed by the RIE. In which, the aurum layer 43 is used as the cover layer, and partial area of the silicon monoxide layer 31 is exposed.

Finally, the above manufactured structures are released to be suspended. The release of the manufactured structures is achieved by removing the sacrifice layer (silicon nitride 22). Etching methods for removing the sacrifice layer include the wet etching and the dry etching. In the dry etching, the sacrifice layer is removed by the hydrofluoric acid (gas state) or the plasma. In the wet etching, the sacrifice layer is removed by the hydrofluoric acid solution. In which, the wet etching is a more economic and popular method.

The release of the manufactured components according to a preferred embodiment of the present invention is carried out with reference to that of the Multi-User MEMS Processes (MUMs). In the MUMPs, the release of the manufactured components is achieved by being etched with hydrofluoric acid solution for 1.5–2.0 minutes, immersed into the deionised water for several minutes, immersed into the alcohol for a while, and heated. In which, the processing of heating is used to remove the residual liquid. However, the release of the manufactured components according to the present invention is similar to that of the MUMPs, and the relevant results are shown in FIG. 5(a).

Figure 5A:
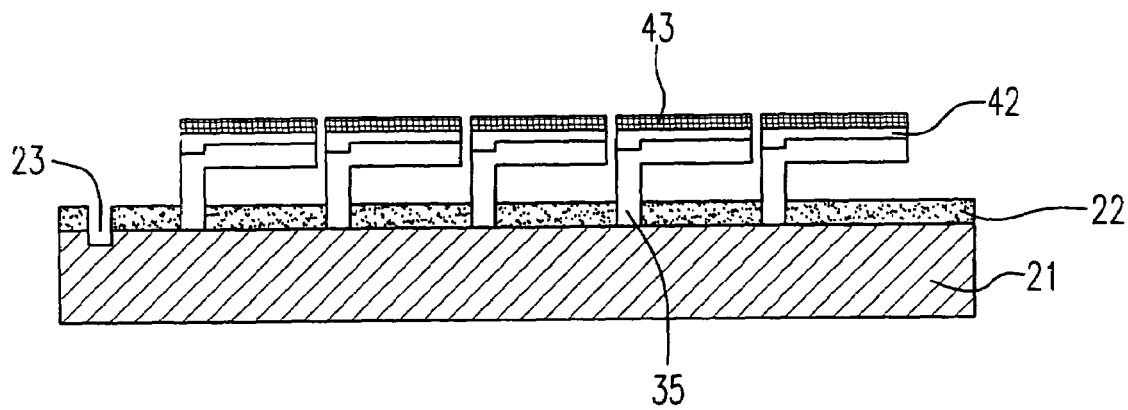
FIG. 5(a) is a side view of the manufacturing method of the micro actuated blazed gratings according to a preferred embodiment of the present invention.

Please refer to FIG. 5(a), which is a side view of the manufactured micro actuated blazed gratings according to a preferred embodiment of the present invention. As shown in FIG. 5(a), the manufactured main body of the micro actuated blazed grating is immersed into the 49% hydrofluoric acid for removing the silicon monoxide layer 31, wherein the immersed period is determined by the thickness of the silicon monoxide layer 31 and the size of the manufactured main body of the micro actuated blazed grating. The larger the size of the main body of the micro actuated blazed grating is, the longer etching time it needs. For example, in this embodiment, the size of the main body of the micro actuated blazed grating is 25 μm×100 μm and the thickness of the silicon monoxide layer 31 is 1.5 μm, and the immersed period is about 8.5 minutes. After etched with the 49% hydrofluoric acid solution, the manufactured structure is immersed into the deionized water for at least 30 minutes in order to dilute the residual hydrofluoric acid. After that, the manufactured structure is immersed into the solution with high volatility, such as the alcohol, the isopropanol, or the methanol, for several hours in order to increase the volatility of the remained deionized water. Then, the manufactured structure is baked under 120° C. for 24 hours in order to release the manufactured components. Finally, the micro actuated blazed grating as shown in FIG. 5(a) is obtained.

Figure 5B:
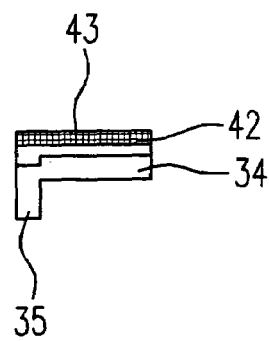
FIG. 5(b) is a side view of the manufacturing method of a single micro actuated blazed grating according to a preferred embodiment of the present invention.

In addition, please refer to FIG. 5(b), which shows a side view of the single manufactured micro actuated blazed grating according to a preferred embodiment of the present invention. As shown in FIG. 5(b), the single micro actuated blazed grating includes the structural pillar 35, the main body made from the silicon nitride 34, the chromium layer 42 and the aurum layer 43.

As above-mentioned description, the present invention not only provides a new manufacturing method of using the silicon oxide, instead of the conventional aluminum sacrifice layer and the copper sacrifice layer, to solve the problem of the unideal performance of the conventional sacrifice layer (made from the aluminum or the copper), but also provides a new processing condition, such as lower processing temperature and longer processing period, to replace the conventional processing so as to increase the structural stability. Further, the manufacturing method provided in the present invention also increases the etching-resist ability of the structure of the present grating than that of the prior grating by controlling the evaporation deposition rate of the adhesive layer at a low rate of 0.1–0.2 Å/sec. In such a way, the adhesive layer would be able to sustain the hydrofluoric acid for about 20 min without being spoiled and lifted up, which is a significant enhancement compared to the time of 5–8 min that the conventional adhesive layer is spoiled and lifted up. Therefore, the invention has originality, novelty and progressiveness. Things like that, effectively improving the defaults of the prior arts and being worthy for the industries are the purposes of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a grating, comprising steps of:
   a) providing a substrate;
   b) forming a first insulating layer on said substrate;
   c) forming a silicon oxide layer on said first insulating layer;
   d) forming and hard baking under a temperature of 70° C. to 90° C. for 2 to 5 hours a photoresist on said silicon oxide layer for defining a plurality of specific zones;
   e) etching said first insulating layer and said silicon oxide layer within said specific zones respectively for forming a plurality of concaves;
   f) forming a second insulating layer on said silicon oxide layer, wherein said second insulating layer fills said concaves for forming a plurality of structural pillars therein;
   g) defining a plurality of grating zones onto said second insulating layer;
   h) forming an adhesive layer and a conductive layer on said grating zones in sequence, wherein said grating zones comprise said structural pillars;
   i) removing parts of said second insulating layer located outside of said grating zones; and
   j) removing said silicon oxide layer for exposing a plurality of grating structures within said grating zones.

2. The method as claimed in claim 1, wherein said substrate is a silicon insulating substrate.

3. The method as claimed in claim 1, wherein said first insulating layer and said second insulating layer both are silicon nitride layers formed by a low pressure chemical vapor deposition (LPCVD).

4. The method as claimed in claim 3, wherein said first insulating layer has a thickness ranged from 2500~3000 Å.

5. The method as claimed in claim 1, wherein said step b) further comprises a step b1) of forming an electrode on said first insulating layer.

6. The method as claimed in claim 1, wherein said step c) is performed by a plasma enhanced chemical vapor deposition (PECVD).

7. The method as claimed in claim 1, wherein said silicon oxide layer has a thickness ranged from 1.5~2 μm.

8. The method as claimed in claim 1, wherein said step e) is performed by a reactive ion etching (RIE).

9. The method as claimed in claim 1, wherein said step h) is proceeded with an evaporation deposition rate of 0.1~0.2 Å/sec.

10. The method as claimed in claim 1, wherein said adhesive layer comprises a metal material selected from a group consisting of a chromium (Cr), a titanium (Ti), and an alloy of titanium (Ti) and tungsten (W).

11. The method as claimed in claim 1, wherein said adhesive layer has a thickness ranged from 150~200 Å.

12. The method as claimed in claim 1, wherein said conductive layer is a gold layer.

13. The method as claimed in claim 12, wherein said gold layer has a thickness ranged from 1500~2000 Å.

14. The method as claimed in claim 1, wherein said step i) is performed by an RIE method.

15. The method as claimed in claim 1, wherein said step j) is performed by a wet etching method using an etching solution.

16. The method as claimed in claim 15, wherein said etching solution is a hydrofluoric acid (HF).

* * * * *